(12) United States Patent
Huang et al.

(10) Patent No.: US 11,927,312 B2
(45) Date of Patent: Mar. 12, 2024

(54) ELECTRONIC DEVICE

(71) Applicant: Innolux Corporation, Miao-Li County (TW)

(72) Inventors: Chin-Chia Huang, Miao-Li County (TW); Chieh-Ying Chen, Miao-Li County (TW); Jia-Huei Lin, Miao-Li County (TW); Chin-Tai Hsu, Miao-Li County (TW); Tzu-Chien Huang, Miao-Li County (TW); Fu-Sheng Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 11 days.

(21) Appl. No.: 17/723,410

(22) Filed: Apr. 18, 2022

(65) Prior Publication Data

US 2022/0364687 A1    Nov. 17, 2022

Related U.S. Application Data

(60) Provisional application No. 63/187,949, filed on May 13, 2021.

(30) Foreign Application Priority Data

Jan. 4, 2022   (CN) .......................... 202210006086.3

(51) Int. Cl.
*F21K 9/68*   (2016.01)
*F21V 7/04*   (2006.01)
(Continued)

(52) U.S. Cl.
CPC ................ *F21K 9/68* (2016.08); *F21V 7/043* (2013.01); *F21V 7/05* (2013.01); *F21V 7/24* (2018.02);
(Continued)

(58) Field of Classification Search
CPC ... F21K 9/68; F21V 7/043; F21V 7/05; F21V 7/24; F21V 33/0052; H01L 25/0753;
(Continued)

(56) References Cited

U.S. PATENT DOCUMENTS

2020/0075820 A1    3/2020  Han et al.

FOREIGN PATENT DOCUMENTS

CN        210605276           5/2020
CN        210605276 U    *    5/2020

OTHER PUBLICATIONS

"Office Action of Taiwan Counterpart Application", dated Dec. 26, 2022, p. 1-p. 6.

* cited by examiner

*Primary Examiner* — Elmito Breval
(74) *Attorney, Agent, or Firm* — JCIPRNET

(57) ABSTRACT

The disclosure provides an electronic device, including a circuit board, multiple semiconductor components, a first light reflecting structure, and a second light reflecting structure. The circuit board includes a substrate, and the substrate may have a first surface and at least one side surface. The multiple semiconductor components are disposed on the first surface. The first light reflecting structure is disposed on the first surface. The second light reflecting structure is disposed on the first surface and the at least one side surface.

18 Claims, 6 Drawing Sheets

(51) Int. Cl.
  *F21V 7/05*      (2006.01)
  *F21V 7/24*      (2018.01)
  *F21V 33/00*     (2006.01)
  *H01L 25/075*    (2006.01)
  *H01L 27/15*     (2006.01)
  *F21Y 105/16*    (2016.01)
  *F21Y 115/10*    (2016.01)

(52) U.S. Cl.
  CPC ...... F21V 33/0052 (2013.01); H01L 25/0753 (2013.01); H01L 27/156 (2013.01); *F21Y 2105/16* (2016.08); *F21Y 2115/10* (2016.08)

(58) Field of Classification Search
  CPC .... H01L 27/156; H01L 33/60; F21Y 2105/16; F21Y 2115/10; H05K 2201/0145; H05K 2201/0154; H05K 1/0274; H05K 2201/2054; H05K 1/181
  See application file for complete search history.

ELECTRONIC DEVICE

CROSS-REFERENCE TO RELATED APPLICATION

This application claims the priority benefits of U.S. provisional application Ser. No. 63/187,949, filed on May 13, 2021, and China application serial no. 202210006086.3, filed on Jan. 4, 2022. The entirety of each of the above-mentioned patent applications is hereby incorporated by reference herein and made a part of this specification.

BACKGROUND

Technical Field

The disclosure relates to an electronic device.

Description of Related Art

The application fields of electronic devices are becoming more and more widespread. In different applications, the area and volume of electronic devices vary. Therefore, the design enabling flexible size adjustment is an important development direction.

SUMMARY

According to an embodiment of the disclosure, an electronic device includes a circuit board, a plurality of semiconductor components, a first light reflecting structure, and a second light reflecting structure. The circuit board includes a substrate, and the substrate may have a first surface and at least one side surface. The plurality of semiconductor components are disposed on the first surface. The first light reflecting structure is disposed on the first surface. The second light reflecting structure is disposed on the first surface and the at least one side surface.

According to an embodiment of the disclosure, an electronic device includes multiple circuit boards. Each of the circuit boards includes a substrate, a plurality of semiconductor components disposed on the substrate, and a first light reflecting structure disposed on the substrate. The electronic device further includes a second light reflecting structure. The second light reflecting structure extends into the gap between two adjacent ones of the circuit boards.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
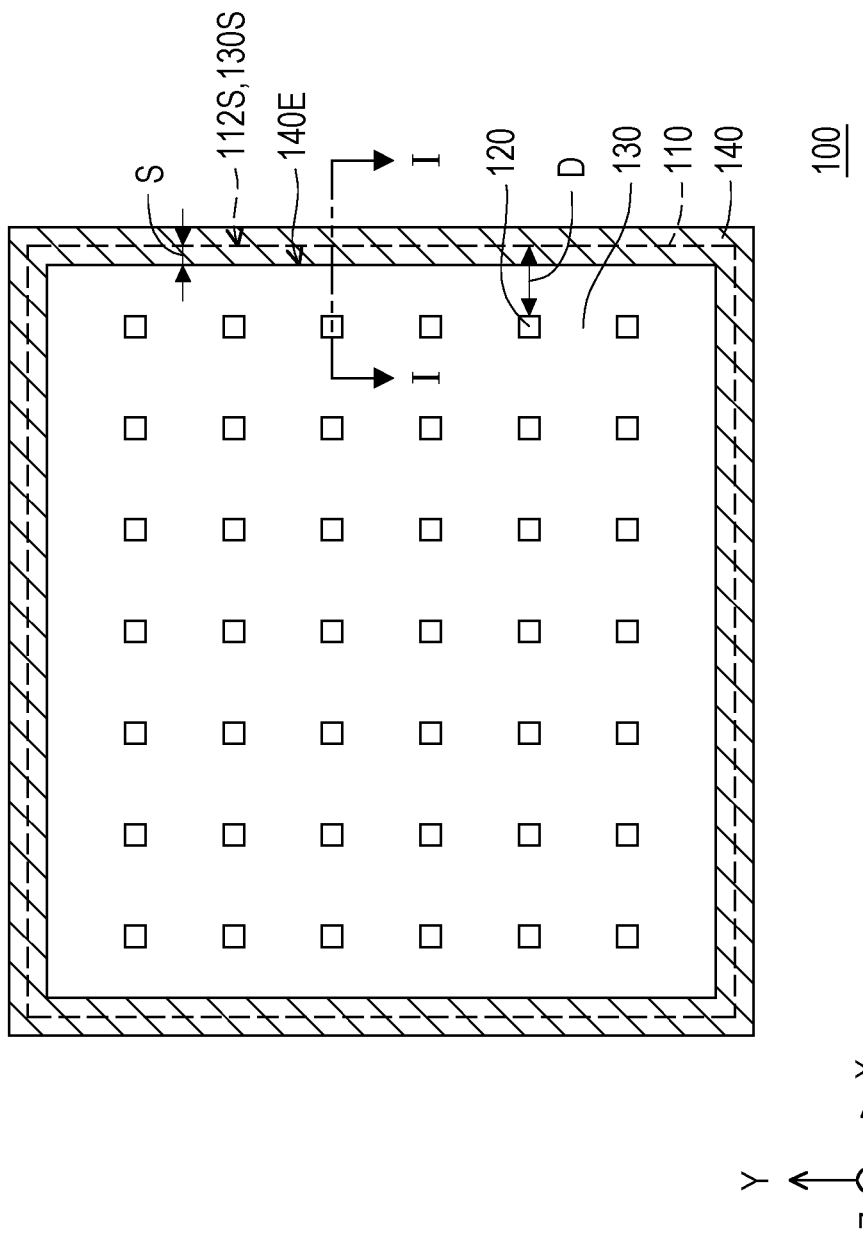
FIG. 1 is a schematic diagram of an electronic device according to an embodiment of the disclosure.

The disclosure may be understood by referring to the following detailed description in conjunction with the accompanying drawings. It should be noted that, in order to facilitate understanding and for the concision of the drawings, only a part of the electronic device is shown in several of the drawings in the disclosure, and the specific components in the drawings are not drawn according to the actual scale. In addition, the number and size of each component in the drawings are for illustration only, and are not intended to limit the scope of the disclosure.

Throughout the description of the disclosure and the appended claims, certain terms may be used to refer to specific components. People skilled in the art should understand that electronic equipment manufacturers may refer to the same components by different names. The disclosure does not intend to distinguish between components that have the same function but have different names.

In the following description and claims, the words "comprising" and "including" are open-ended words, and thus should be interpreted as meaning "including but not limited to . . . "

It should be understood that when a component or film layer is referred to as being "disposed on" or "connected to" another component or film layer, the component or film layer may be directly on or directly connected to this other component or film layer, or an intervening component or film layer is provided in between (an indirect case). In contrast, when a component is referred to as being "directly on" or "directly connected to" another component or film layer, no intervening components or film layers are provided in between. When a component or film layer is referred to as being "electrically connected" to another component or film layer, such a situation may be interpreted as either a direct electrical connection or an indirect electrical connection.

The terms "about", "equal to", "equivalent", "the same", "essentially", or "substantially" are generally construed as within plus or minus 20% of the given value, or as within plus or minus 10%, plus or minus 5%, plus or minus 3%, plus or minus 2%, plus or minus 1%, or plus or minus 0.5% of the given value.

Although the terms "first", "second", "third", and the like may be used to describe various constituent components, the constituent components are not limited to the terms. The terms are only used to distinguish a single constituent component from other constituent components in the specification. The same terms may not be used in the claims, and may be replaced with first, second, third, and the like in the order in which the components are declared in the claims. Therefore, in the following description, the first constituent element may be the second constituent element in the claims.

The electrical connection or coupling described in the disclosure may refer to a direct connection or indirect connection. In the case of a direct connection, the endpoints of components on two circuits are directly connected or connected to each other by a conductor segment. In the case of an indirect connection, switches, diodes, capacitors, inductors, resistors, other suitable components, or a combination of the aforementioned components may be provided between the endpoints of the components on two circuits. However, the disclosure is not limited thereto.

In the disclosure, the length, width, thickness, height, or area of each component, or the distance or spacing between components may be measured using an optical microscope (OM), a scanning electron microscope (SEM), a film thickness profiler (α-step), an ellipsometer, or other suitable methods. In detail, according to some embodiments, an SEM may be used to obtain a cross-sectional structure image including the component to be measured, and measure the width, thickness, height, or area of each component, or the distance or spacing between components. However, the disclosure is not limited thereto. In addition, any two values or directions used for comparison may have certain errors.

In addition, the terms "equal to", "equivalent", "the same", "essentially", "about", or "substantially" referred to in the disclosure generally mean within 10%, within 5%, within 3%, within 2%, within 1%, or within 0.5% of a given value or range. Furthermore, the terms "a given range is from a first value to a second value" or "a given range is within a range from the first value to the second value" mean that the given range includes the first value, the second value, and the other values in between. If a first direction is perpendicular to a second direction, the angle between the first direction and the second direction may be between 80 degrees and 100 degrees. If the first direction is parallel to the second direction, the angle between the first direction and the second direction may be between 0 degrees and 10 degrees.

Unless otherwise defined, all terms (including technical and scientific terms) used herein may have the same meanings as commonly understood by one of skill in the art to which the disclosure belongs. It is understood that these terms, such as those defined in commonly used dictionaries, should be interpreted as having meanings consistent with the relevant art and the background or context of the disclosure, and should not be interpreted in an idealized or overly formal manner unless otherwise defined in the embodiments of the disclosure.

In the disclosure, the electronic device may include a display apparatus, a sensing device, or a splicing device, but is not limited thereto. The electronic device may be a bendable or flexible electronic device. The display apparatus may be a non-self-luminous display apparatus or a self-luminous display apparatus. The sensing device may be a sensing device for sensing capacitance, light, heat, or ultrasonic waves, but is not limited thereto. In the disclosure, electronic components may include passive components and active components, such as capacitors, resistors, inductors, diodes, transistors, and the like. The diodes may include light emitting diodes or photodiodes. The light emitting diodes may include, for example, organic light emitting diodes (OLEDs), sub-millimeter light emitting diodes (mini LEDs), micro light emitting diodes (micro LEDs), or quantum dot light emitting diodes (quantum dot LEDs), but are not limited thereto. In the disclosure, the display panel may include a self-luminous or non-self-luminous panel. The self-luminous panel includes, for example, an OLED, mini LED, micro LED, or quantum dot LED panel, but is not limited thereto. The non-self-luminous panel includes, for example, a liquid crystal panel or a panel made of other suitable materials. It should be noted that the electronic device may be any arrangement or combination of the foregoing, but is not limited thereto. Hereinafter, the disclosure is described with a splicing device. However, the disclosure is not limited thereto.

It should be mentioned that the technical solutions provided by the different embodiments hereinafter may be replaced, combined, or used in combination, so as to constitute another embodiment without violating the spirit of the disclosure.

Figure 2:
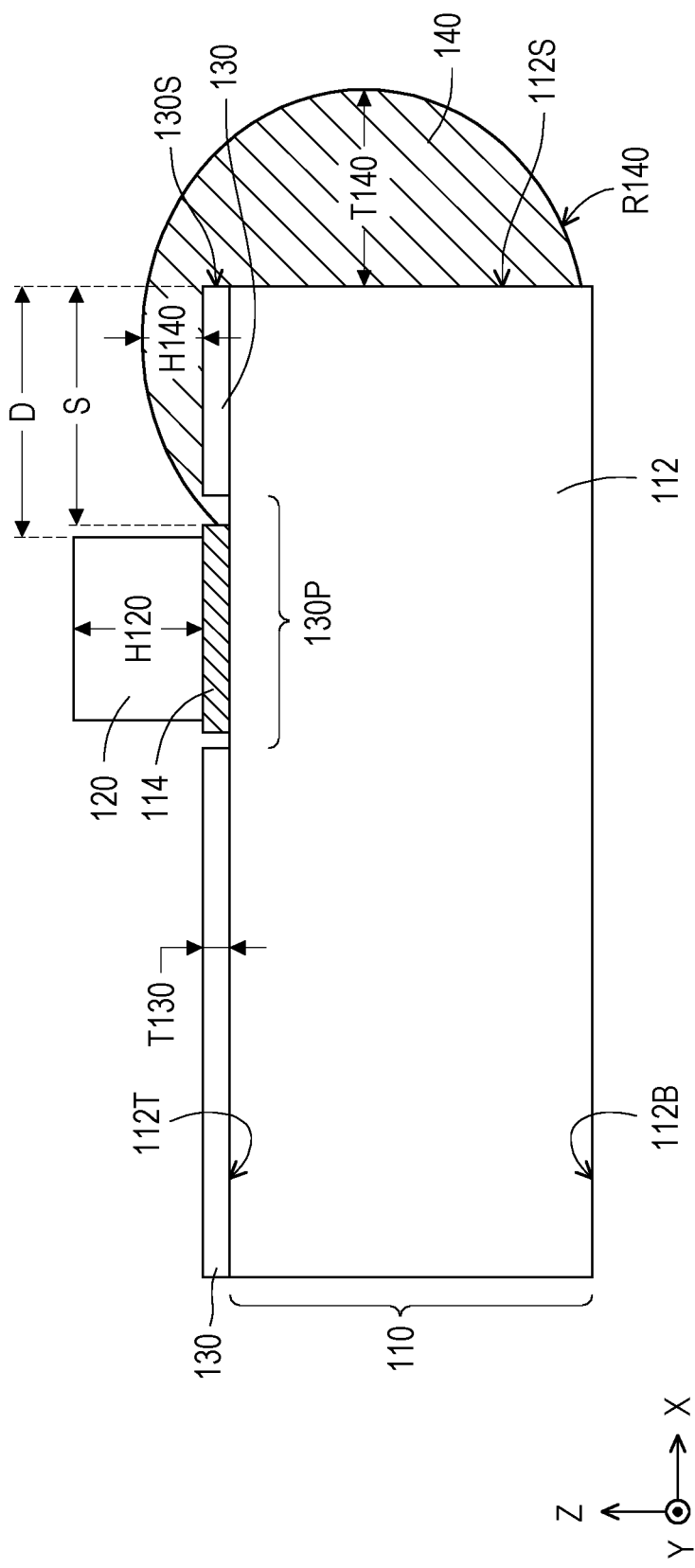
FIG. 2 is a schematic cross-sectional view of the electronic device of FIG. 1 along the line I-I.

FIG. 1 is a schematic diagram of an electronic device according to an embodiment of the disclosure. FIG. 2 is a schematic cross-sectional view of the electronic device of FIG. 1 along the line I-I. As shown in FIGS. 1 and 2, an electronic device 100 includes a circuit board 110, a plurality of semiconductor components 120, a first light reflecting structure 130, and a second light reflecting structure 140. The circuit board 110 includes a substrate 112. The substrate 112 may include, for example, a flexible substrate or a non-flexible substrate. The material of the substrate 112 may include, for example, glass, ceramic, quartz, sapphire, acrylic, polyimide (PI), polyethylene terephthalate (PET), polycarbonate (PC), other suitable materials, or a combination of the above, and is not limited thereto.

Specifically, the substrate 112 may have a first surface 112T, a second surface 112B, and at least one side surface 112S, the first surface 112T and the second surface 112B are opposite to each other, and the side surface 112S is connected between the first surface 112T and the second surface 112B. In some embodiments, the first surface 112T and the second surface 112B may be parallel to the plane formed by the X axis and the Y axis, and the side surface 112S may extend along the Z axis (the normal direction of the substrate). However, the embodiments are not limited thereto. The semiconductor components 120 are disposed on the substrate 112, and specifically disposed on the first surface 112T of the substrate 112. The first light reflecting structure 130 is also disposed on the first surface 112T of the substrate 112. The second light reflecting structure 140 is disposed on the first surface 112T and the side surface 112S of the substrate 112. As shown in FIGS. 1 and 2, the first light reflecting structure 130 and the second light reflecting structure 140 may be disposed on the first surface 112T around the periphery (four sides) of the substrate 112, and the second light reflecting structure 140 may be disposed on the side surface 112S. In some embodiments, the second light reflecting structure 140 may be located on at least one side surface of the substrate 112 and may cover at least a part of the first surface 112T and the side surface 112S. In some embodiments, at least a part of the first surface 112T 112 and the side surface 112S of the substrate may be covered by another reflecting structure. In some embodiments, when the semiconductor components 120 may have a light emitting function, the light emitted by the semiconductor components 120 may be reflected by the first light reflecting structure 130 and the second light reflecting structure 140 to be utilized more effectively. Therefore, the electronic device 100 may have good light utilization efficiency. The substrate 112 of the circuit board 110 may, in some embodiments, include multiple layers of conductive circuit layers (not shown) and multiple layers of insulating layers (not shown). For example, the circuit board 110 may be a multi-layer circuit board, but is not limited thereto. The conductive circuit layers are configured to transmit power and/or corresponding electrical signals to the semiconductor components 120 to drive the semiconductor components 120, for example, to make the semiconductor components 120 emit light, but are not limited thereto. The insulating layers are configured to separate different conductive circuit layers to avoid unwanted short circuits. In addition, the circuit board 110 may have pads 114 for bonding with the semiconductor components 120, and the pads 114 are located on the first surface 112T of the substrate 112. In some embodiments, the light reflectance of the first light reflecting structure 130 is, for example, greater than the light reflectance of the second light reflecting structure 140. In some embodiments, the light reflectance of the first light reflecting structure 130 is, for example, 70% to 99%. In some embodiments, the light reflectance of the second light reflecting structure 140 is, for example, 63% to 98%.

The semiconductor components 120 may be bonded to the pads 114 by flip chip bonding, wire bonding, or other alternative bonding methods. In this way, the semiconductor components 120 may be electrically connected to the conductive circuit layers in the circuit board 110. In some embodiments, the semiconductor component 120 may include a semiconductor chip, such as a light emitting diode chip, but is not limited thereto. In some embodiments, reflective walls (not shown) may further be included. The reflective walls are disposed on two side surfaces of the semiconductor component 120 to reflect light on the two side surfaces of the semiconductor component 120, but are not limited thereto. In other embodiments, the semiconductor component 120 may include a package component including a semiconductor chip and a package material encapsulating the semiconductor chip. The semiconductor component 120 in the embodiments is, for example, a light emitting component. The light emission color of the semiconductor component 120 may be determined by the light emission characteristics of the semiconductor chip or the light characteristics of the semiconductor chip and the light conversion material (or the color filter material). The light emission color of the semiconductor component 120 includes, for example, red, blue, green, yellow, cyan, white, and the like. In addition, the semiconductor components 120 on the circuit board 110 may have different light emission colors or the same light emission color. In this way, the electronic device 100 may be a light emitting device, a display apparatus, or other devices having a light emitting function. In some embodiments, the semiconductor components 120 may include diodes, thin film transistors, etc. in addition to semiconductor chips, but are not limited thereto. In some embodiments, a driver chip (not shown) and the semiconductor component 120 may further be included, and the driver chip is electrically connected to the semiconductor component 120.

As shown in FIGS. 1 and 2, the first light reflecting structure 130 is disposed on the first surface 112T and may be distributed among the semiconductor components 120 along the first surface 112T. The first light reflecting structure 130 may at least partially not overlap the semiconductor component 120. In some embodiments, the first light reflecting structure 130 may cover most of the area of the first surface 112T, and may have multiple openings 130P. The openings 130P may expose the pads 114 on the substrate 112, and the semiconductor components 120 are correspondingly disposed in the openings 130P and connected to the pads 114. The material of the first light reflecting structure 130 includes an acrylic resin material, such as solvent-free white resin, but is not limited thereto. In some embodiments, the first light reflecting structure 130 may cover at least two side surfaces of the semiconductor component 120 (e.g., the left and right side surfaces and/or the front and rear side surfaces, etc.), but is not limited thereto. The first light reflecting structure 130 is, for example, white, and may have good light reflection properties, which may reflect the light emitted by the semiconductor components 120, and may help improve the light utilization efficiency of the electronic device 100. In some embodiments, the first light reflecting structure 130 may be interpreted as white paint, white glue, or similar materials. The light reflectance of the first light reflecting structure 130 is, for example, about 70% to 99%. In some embodiments, the first light reflecting structure 130 may have high shielding properties (e.g., may have a high optical density). In some embodiments, the first light reflecting structure 130 may be formed on the first surface 112T of the substrate 112 by means of coating, printing, or the like. In some embodiments, the first light reflecting structure 130 may be further dried and cured by means of light, heat, or the like.

In some embodiments, the circuit board 110 may be cut from a large-sized mother circuit board (not shown). For example, the manufacturing method of the circuit board 110 may include firstly forming the first light reflecting structure 130 on the mother circuit board by means of coating, printing, or the like, and then cutting the mother circuit board to obtain the circuit board 110 of a desired size. In this way, the side surface 130S of the first light reflecting structure 130 may be substantially aligned with the side surface 112S of the substrate 112. In some embodiments, the circuit board 110 and the first light reflecting structure 130 may be fabricated in other alternative ways. In some embodiments, the side surface 130S of the first light reflecting structure 130 may be retracted relative to the side surface 112S of the substrate 112 to partially expose the peripheral portion of the first surface 112T of the substrate 112. In some embodiments, the first light reflecting structure 130 may extend from the first surface 112T of the substrate 112 to the side surface 112S and partially cover the side surface 112S. In addition, in some embodiments, after the first light reflecting structure 130 is formed on the mother circuit board, the semiconductor components 120 may be bonded to the circuit board 110 first, and then the individual circuit board 110 may be cut from the mother circuit board. In some embodiments, the bonding of the semiconductor components 120 may be performed after dicing of the mother circuit board.

The second light reflecting structure 140 is disposed on the first surface 112T and the side surface 112S. The second light reflecting structure 140 is generally disposed along the periphery of the circuit board 110 and surrounds the circuit board 110, as shown in FIG. 1, but is not limited thereto. When the circuit board 110 may have a polygonal shape, the second light reflecting structure 140 may be selectively disposed along one edge, several edges, or all edges of the circuit board 110. In some embodiments, the second light reflecting structure 140 may be selectively disposed along a partial section of one of the edges. For example, one of the edges of the circuit board 110 may include a section covered by the second light reflecting structure 140 and a section not covered by the second light reflecting structure 140. As can be seen from FIG. 2, the second light reflecting structure 140 may overlap the first light reflecting structure 130 and extend outward from the first light reflecting structure 130 to a portion of the circuit board 110 not covered by the first light reflecting structure 130. For example, the first light reflecting structure 130 does not cover the side surface 112S of the circuit board 110, and the second light reflecting structure 140 covers the side surface 112S of the circuit board 110. In some embodiments, the second light reflecting structure 140 may even extend to the second surface 112B of the substrate 112 to completely cover the side surface 112S, but is not limited thereto.

In the embodiment, the second light reflecting structure 140 may be fabricated by coating or printing light reflecting materials along the periphery of the circuit board 110. The material of the second light reflecting structure 140 includes an acrylic resin material, such as solvent-free white resin, but is not limited thereto. The second light reflecting structure 140 is, for example, white, and may have good light reflection properties. In some embodiments, the second light reflecting structure 140 may be interpreted as white paint (e.g. Tuffy), white glue, or similar materials. In some embodiments, the first light reflecting structure 130 and the second light reflecting structure 140 may include a common material. In some embodiments, the first light reflecting structure 130 and the second light reflecting structure 140 may include different materials. The light reflectance of the second light reflecting structure 140 is, for example, about 63% to 98%, but is not limited thereto.

In some embodiments, the light reflectance of the first light reflecting structure 130 may be greater than the light reflectance of the second light reflecting structure 140, but is not limited thereto. In some embodiments, the difference between the light reflectance of the first light reflecting structure 130 and the second light reflecting structure 140 is less than or equal to 20% (for example: 20%, 18%, 15%, 10%, 8%, 5%, 3%, etc.). For example, when R represents the light reflectance, the light reflectance of the first light reflecting structure 130 and the second light reflecting structure 140 may satisfy the following relationship: (R first light reflecting structure–R second light reflecting structure) ≤20%. In some embodiments, the light reflectance of the first light reflecting structure 130 is about 70% to 80%, and the light reflectance of the second light reflecting structure 140 is about 63% to 78%. In some embodiments, the light reflectance of the first light reflecting structure 130 is 81% to 90%, and the light reflectance of the second light reflecting structure 140 is about 75% to 88%. In some embodiments, the light reflectance of the first light reflecting structure 130 is about 91% to 99%, and the light reflectance of the second light reflecting structure 140 is about 85% to 98%. In some embodiments, the light reflectance of the first light reflecting structure 130 is about 70% to 99%, and the light reflectance of the second light reflecting structure 140 is about 63% to 98%.

The light reflectance may be measured using a high performance spectrophotometer (ColorQuest XE), but is not limited thereto. The measurement of the ColorQuest XE may meet standards including: CIE 15:2004, ISO 7724/1, ASTM E1164, DIN 5033 Teil 7, and JIS Z 8722 Condition C. In some embodiments, the light reflectance of the first light reflecting structure 130 may be obtained by measuring three to five points on the first surface 112T using a high performance spectrophotometer and averaging these measuring points, but is not limited thereto. The measurement method of the light reflectance of the second light reflecting structure 140 may firstly stack multiple electronic devices 100 so that the second light reflecting structures 140 of the multiple electronic devices 100 are arranged side by side to form a sufficient measurement area, use high performance spectrophotometer to measure three to five points on the measurement area, and then obtain the average value of these measuring points, but is not limited thereto. However, the measurement method and measurement instrument of the light reflectance are not limited to the above-mentioned methods.

The second light reflecting structure 140 may have a contour surface R140 in the cross-sectional structure of FIG. 2, and the contour surface R140 is arc-shaped, but is not limited thereto. The maximum distance between the contour surface R140 and the substrate 112 may be regarded as the thickness T140 of the second light reflecting structure 140. In some embodiments, the thickness T140 of the second light reflecting structure 140 is greater than the thickness T130 of the first light reflecting structure 130. In addition, the portion (e.g., T140) of the second light reflecting structure 140 on the side surface 112S of the substrate 112 may be thicker than the portion (e.g., H140) on the first surface 112T of the substrate 112, but is not limited thereto. In some embodiments, the second light reflecting structure 140 may not overlap the semiconductor component 120, and the maximum extension width S of the second light reflecting structure 140 extending from the side surface 112S of the substrate 112 toward the semiconductor component 120 on the first surface 112T may not exceed the minimum distance D between the semiconductor component 120 and the side surface 112S of the substrate 112 on the first surface 112T. In some embodiments, the maximum extension width S and the minimum distance D may satisfy the following relationship: $0.01 \text{ mm} \leq S \leq D-0.1 \text{ mm}$. In addition, the maximum height H140 of the second light reflecting structure 140 protruding away from the substrate 112 along the Z axis on the first surface 112T may not be greater than the maximum height H120 of the semiconductor component 120 protruding away from the substrate 112 along the Z axis on the first surface 112T (that is, $H140 \leq H120$). As shown in FIG. 2, the second light reflecting structure 140 may cover the first light reflecting structure 130 on the first surface 112T and may cover the side surface 130S of the first light reflecting structure 130. Since the first light reflecting structure 130 covers most of the area of the first surface 112T, and the second light reflecting structure 120 covers the periphery and the side surface 112S of the first surface 112T, the first light reflecting structure 130 and the second light reflecting structure 140 may reflect the light emitted by the semiconductor component 120 and may achieve good light utilization efficiency. In some embodiments, the second light reflecting structure 140 may be further dried and cured by means of light or heat.

Figure 3:
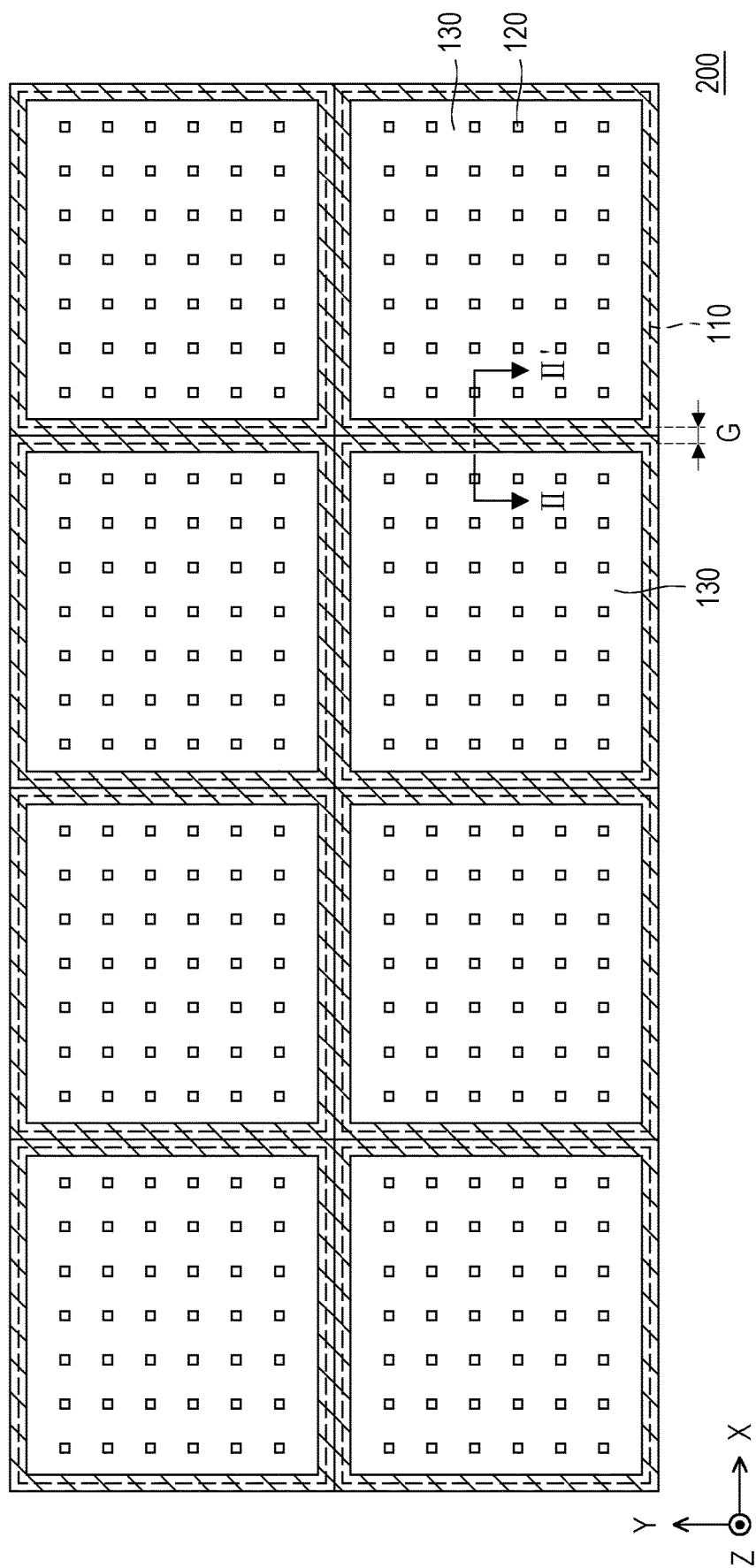
FIG. 3 is a schematic diagram of an electronic device according to an embodiment of the disclosure.
Figure 4:
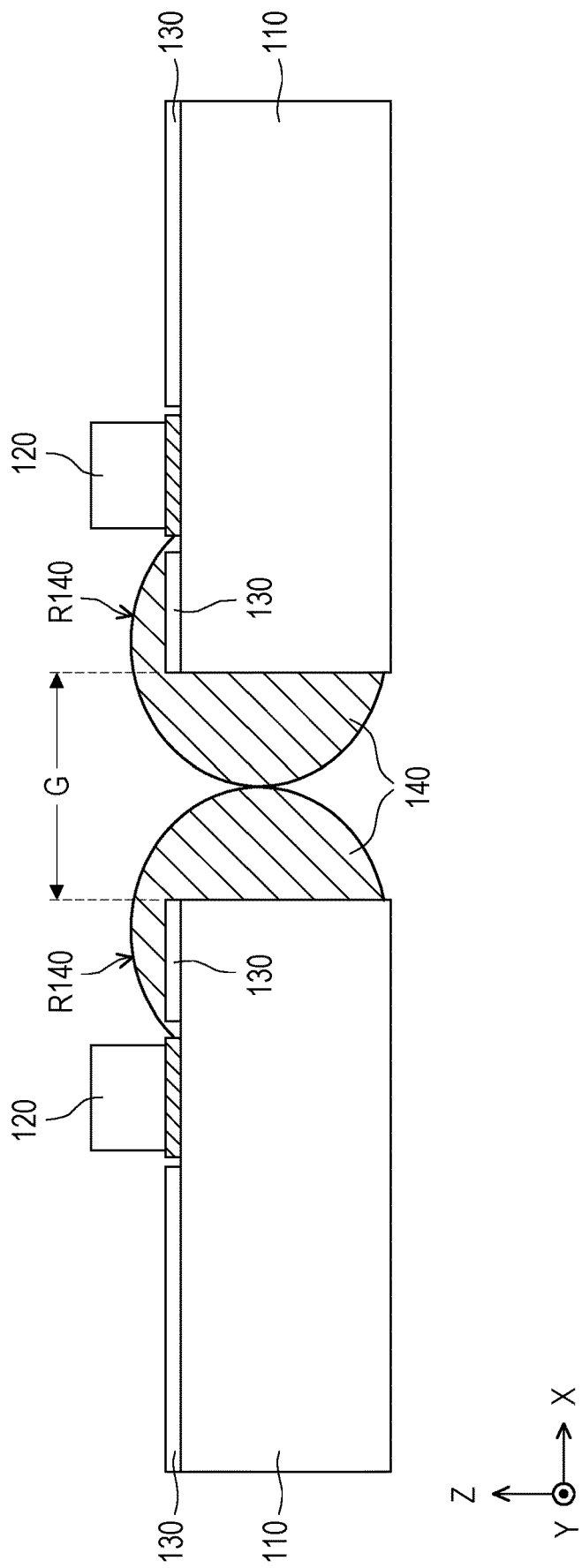
FIG. 4 is a schematic cross-sectional view of the electronic device of FIG. 3 along the line II-II.

FIG. 3 is a schematic diagram of an electronic device according to an embodiment of the disclosure, and FIG. 4 is a schematic cross-sectional view of the electronic device of FIG. 3 along the line II-II. In FIGS. 3 and 4, an electronic device 200 includes multiple circuit boards 110, and each circuit board 110 and another circuit board 110 are spliced to each other in a lateral direction, such as the X-axis or the Y-axis direction. As shown in FIG. 4, each circuit board 110 is disposed with multiple semiconductor components 120, a first light reflecting structure 130, and a second light reflecting structure 140. Specifically, the electronic device 200 may be formed by splicing multiple the above-mentioned electronic devices 100. In the embodiment, the configuration relationship, the structure, the material, and the manufacturing method of the circuit board 110, the semiconductor components 120, the first light reflecting structure 130, and the second light reflecting structure 140 may be referred to the related descriptions of FIGS. 1 and 2, and not repeated. In the embodiment, a gap G is provided between two adjacent circuit boards 110, and the second light reflecting structure 140 disposed on each circuit board 110 is located in the gap G. The second light reflecting structures 140 on the two adjacent circuit boards 110 are in contact with each other, but are not limited thereto. At the edge of each circuit board 110, the contour surface R140 of the second light reflecting structure 140 is arc-shaped. Therefore, two adjacent second light reflecting structures 140 may form the double arc contour surface shown in FIG. 4, but are not limited thereto. In some embodiments, the two adjacent second light reflecting structures 140 may completely fill the gap G, but are not limited thereto. In some embodiments, the width of the two adjacent second light reflecting structures 140 in the gap G measured along the X axis (that is, the width protruding from each circuit board 110 to the adjacent circuit board 110) may be the same or different. In some embodiments, multiple gaps G are provided between the multiple circuit boards 110, and the widths of the gaps G measured along the X-axis direction or the widths measured along the Y-axis direction may be the same or different.

The semiconductor component 120 is, for example, a light emitting component. When the semiconductor component 120 emits light, the second light reflecting structure 140 may reflect the light at the gap G between the two adjacent circuit boards 110. Therefore, the electronic device 200 is less likely to have dark streaks at the gap G, and may provide a uniform light emitting effect. When each circuit board 110 is a polygon, the second light reflecting structure 140 may be selectively disposed along only a part of the edge of the circuit board 110 or along all the edges of the circuit board 110. In some embodiments, the second light reflecting structure 140 may be selectively disposed only along the edges of each circuit board 110 adjacent to other circuit boards 110, and the second light reflecting structure 140 may be omitted on the edges of each circuit board 110 not adjacent to other circuit boards 110. However, the embodiments are not limited thereto. In addition, the number of circuit boards 110 that the electronic device 200 may have may be adjusted according to usage requirements.

Figure 5:
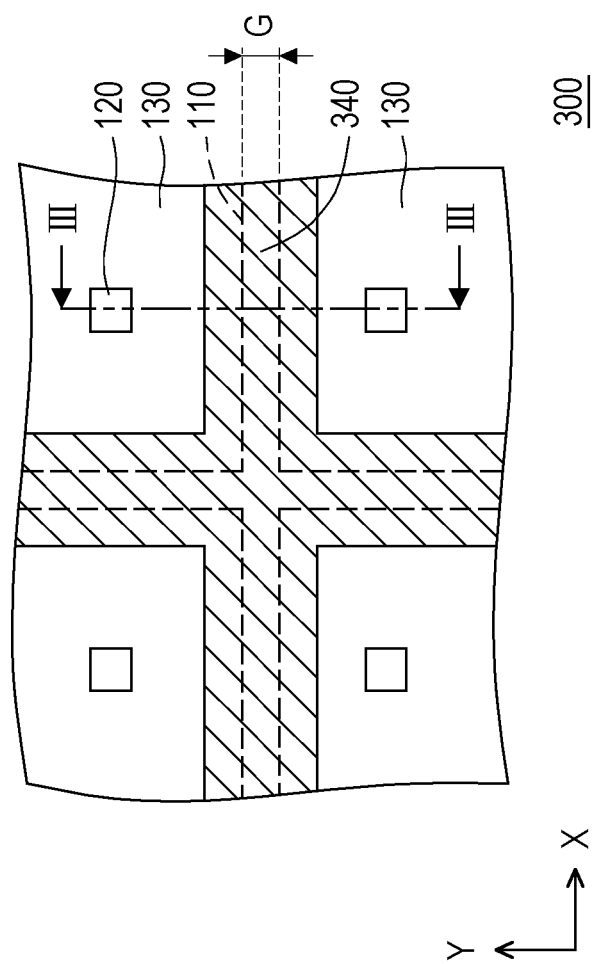
FIG. 5 is a partial schematic view of an electronic device according to an embodiment of the disclosure.
Figure 6:
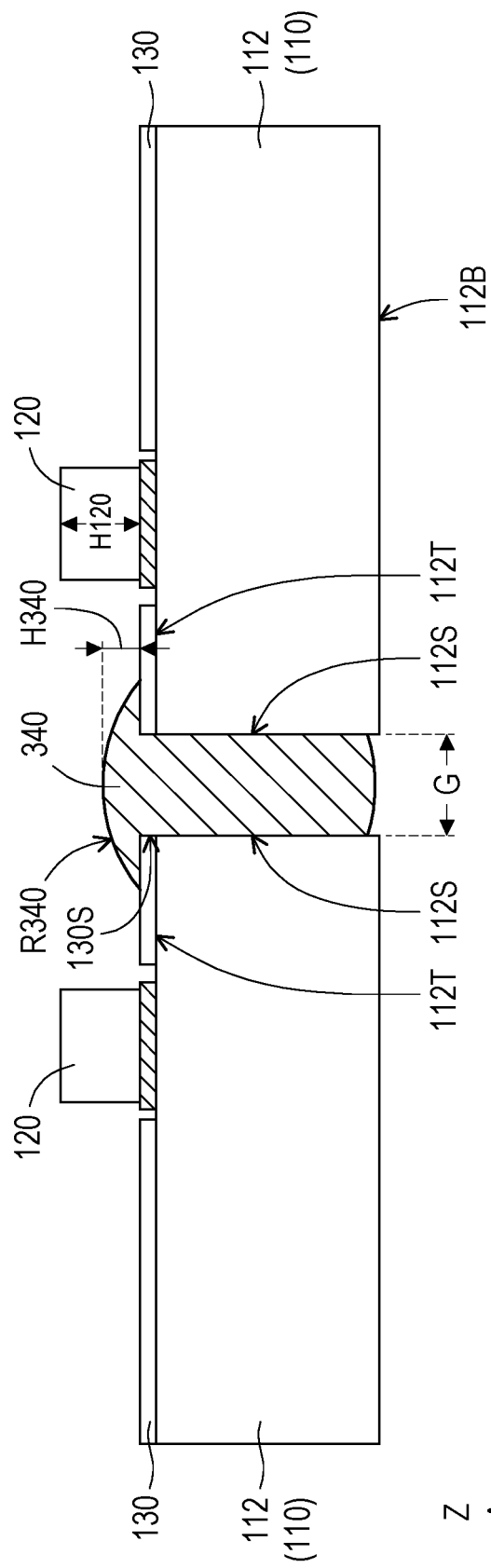
FIG. 6 is a schematic cross-sectional view of the electronic device of FIG. 5 along the line III-III.

FIG. 5 is a partial schematic view of an electronic device according to an embodiment of the disclosure, and FIG. 6 is a schematic cross-sectional view of the electronic device of FIG. 5 along the line III-III. In FIGS. 5 and 6, an electronic device 300 includes multiple circuit boards 110, and two adjacent circuit boards 110 are spliced to each other in a lateral direction, such as the X-axis or the Y-axis direction. As shown in FIG. 6, multiple semiconductor components 120 and a first light reflecting structure 130 are disposed on each circuit board 110. In the embodiment, the configuration relationship, the structure, the material, and the manufacturing method of the circuit board 110, the semiconductor device 120, and the first light reflecting structure 130 may be referred to the above-mentioned descriptions of FIGS. 1 and 2, and not repeated. In the embodiment, a gap G exists between the two adjacent circuit boards 110, and the electronic device 300 includes a second light reflecting structure 340 extending to the gap G.

In the embodiment, the manufacturing method of the electronic device 300 may include arranging and fixing the circuit boards 110 side by side so that the gap G is provided between the two adjacent circuit boards 110, and then disposing the second light reflecting structure 340 in the gap G. The material of the second light reflecting structure 340 may be similar to the material of the second light reflecting structure 140 of the foregoing embodiment, such as an acrylic resin material. In some embodiments, the light reflectance of the second light reflecting structure 340 is, for example, about 63% to 98%. In some embodiments, the light reflectance of the first light reflecting structure 130 is about 70% to 99%. In some embodiments, the light reflectance of the first light reflecting structure 130 may be greater than the light reflectance of the second light reflecting structure 340. In some embodiments, the light reflectance of the first light reflecting structure 130 is about 70% to 80%, and the light reflectance of the second light reflecting structure 340 is about 63% to 78%. In some embodiments, the light reflectance of the first light reflecting structure 130 is about 81% to 90%, and the light reflectance of the second light reflecting structure 340 is about 75% to 88%. In some embodiments, the light reflectance of the first light reflecting structure 130 is about 91% to 99%, and the light reflectance of the second light reflecting structure 340 is about 85% to 98%. In some embodiments, the light reflectance of the first light reflecting structure 130 is about 70% to 99%, and the light reflectance of the second light reflecting structure 340 is about 63% to 98%.

As shown in FIG. 6, the second light reflecting structure 340 may partially cover the first light reflecting structure 130 on the first surface 112T of the substrate 112 of the corresponding circuit board 110. The second light reflecting structure 340 may extend into the gap G between the two adjacent circuit boards 110 and is in contact with the side surfaces 112S of the corresponding substrates 112 of the two adjacent circuit boards 110. The second light reflecting structure 340 may have a contour surface R340, and the contour surface R340 is arc-shaped, but is not limited thereto. The contour surface R340 may be an arc surface in contact with the two adjacent circuit boards 110, but is not limited thereto. The maximum height H340 of the second light reflecting structure 340 protruding away from the substrate 112 of the circuit board 110 along the Z axis on the first surface 112T may not be greater than the maximum height H120 of the semiconductor component 120 protruding away from the substrate 112 along the Z axis on the first surface 112T (that is, H340≤H120). In some embodiments, the second light reflecting structure 340 may extend further to the second surface 112B of the substrate 112. The semiconductor component 120 is, for example, a light emitting component. When the semiconductor component 120 emits light, the second light reflecting structure 340 may reflect the light at the gap G between the two adjacent circuit boards 110 to avoid the situation where dark streaks occur because the gap G is relatively dark. Therefore, the electronic device 300 of the disclosure may have a uniform lighting effect. In addition, the number of circuit boards 110 that the electronic device 300 may have may be adjusted according to usage requirements.

In some embodiments, multiple circuit boards 110 may be cut from a large-sized mother circuit board (not shown). For example, the first light reflecting structure 130 may be coated on the mother circuit board, and then the corresponding circuit board 110 is cut out. In some embodiments, the side surface 112S of the substrate 112 of the circuit board 110 and the side surface 130S of the first light reflecting structure 130 may be cut flush with each other. In some embodiments, the semiconductor components 120 may be bonded to the corresponding circuit boards 110 before or after the individual circuit boards 110 are cut from the mother circuit board. Next, the cut circuit boards 110 are spliced together. In some embodiments, several circuit boards 110 may be respectively fixed on the backplane or the frame so that the circuit boards 110 may be arranged side by side with a gap G between them. After that, the second light reflecting structure 340 is disposed along the gap G. The formation of the second light reflecting structure 340 may include coating, printing, and the like. The second light reflecting structure 340 may overlap two adjacent ones of the circuit boards 110 and extend into the gap G. The second light reflecting structure 340 may be further dried and cured by means of light or heat. When the circuit board 110 is a polygon, the second light reflecting structure 340 may be selectively disposed along only a part of the edge of the circuit board 110 or along all the edges of the circuit board 110. In some embodiments, the second light reflecting structure 340 may be selectively disposed only along the edges of each circuit board 110 adjacent to other circuit boards 110, and the edges of each circuit board 110 not adjacent to other circuit boards 110 may omit the second light reflecting structure 340. However, the embodiments are not limited thereto.

In summary, in the electronic device of the embodiments of the disclosure, the first light reflecting structure is disposed on the first surface of the circuit board, and the second light reflecting structure is disposed on the first surface and the side surface of the circuit board. In this way, the light emitted by the semiconductor components disposed on the first surface of the circuit board may be reflected on the first surface and the side surface. When the electronic device is formed by splicing multiple circuit boards, the second light reflecting structure is disposed in the gap between adjacent circuit boards so that a local dark area (or dark streaks) is not easy to be generated in the gap. The electronic device of the disclosure may meet the design requirements of different sizes by splicing multiple circuit boards, and may have a uniform light emitting effect. For example, when multiple circuit boards are spliced, the splicing gaps between the circuit boards may be less likely to have dark streaks due to the disposition of the second light reflecting structures.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
    a circuit board comprising:
        a substrate having a first surface and at least one side surface;
    a plurality of semiconductor components disposed on the first surface;
    a first light reflecting structure disposed on the first surface; and
    a second light reflecting structure disposed on the first surface and the at least one side surface, wherein a light reflectance of the first light reflecting structure is greater than a light reflectance of the second light reflecting structure.

2. The electronic device according to claim 1, wherein a light reflectance of the first light reflecting structure is 70% to 99%, and a light reflectance of the second light reflecting structure is 63% to 98%.

3. The electronic device according to claim 1, wherein a minimum distance on the first surface between the plurality of semiconductor components and the at least one side surface of the substrate is D, and a maximum extension width of the second light reflecting structure extending from the at least one side surface of the substrate toward the plurality of semiconductor components on the first surface is S, and 0.01 mm≤S≤D−0.1 mm.

4. The electronic device according to claim 1, further comprising another circuit board, and the circuit board and the another circuit board being spliced to each other in a lateral direction.

5. The electronic device according to claim 1, wherein the first light reflecting structure and the second light reflecting structure comprise a common material.

6. The electronic device according to claim 1, wherein the first light reflecting structure and the second light reflecting structure comprise different materials.

7. The electronic device according to claim 1, wherein the second light reflecting structure has an arc-shaped contour surface.

8. The electronic device according to claim 1, wherein a maximum height of the second light reflecting structure protruding away from the substrate on the first surface is no greater than a maximum height of the plurality of semiconductor components protruding away from the substrate on the first surface.

9. The electronic device according to claim 1, wherein the plurality of semiconductor components comprises a light emitting diode chip.

10. An electronic device, comprising:
    a plurality of circuit boards, each of the plurality of circuit boards comprising a substrate, a plurality of semiconductor components disposed on the substrate, and a first light reflecting structure disposed on the substrate; and
    a second light reflecting structure extending into a gap between two adjacent ones of the plurality of circuit boards, wherein a light reflectance of the first light reflecting structure is greater than a light reflectance of the second light reflecting structure.

11. The electronic device according to claim 10, wherein a light reflectance of the first light reflecting structure is 70% to 99%, and a light reflectance of the second light reflecting structure is 63% to 98%.

12. The electronic device according to claim 10, wherein the first light reflecting structure and the second light reflecting structure comprise a common material.

13. The electronic device according to claim 10, wherein the first light reflecting structure and the second light reflecting structure comprise different materials.

14. The electronic device according to claim 10, wherein the second light reflecting structure is in contact with side surfaces of respective substrates of the two adjacent ones of the plurality of circuit boards.

15. The electronic device according to claim 10, wherein the second light reflecting structure has an arc-shaped contour surface.

16. The electronic device according to claim 10, wherein a maximum height of the second light reflecting structure protruding away from the substrate of a corresponding circuit board is no greater than a maximum height of the plurality of semiconductor components of the corresponding circuit protruding away from the substrate.

17. The electronic device according to claim 10, wherein the plurality of semiconductor components comprises a light emitting diode chip.

18. The electronic device according to claim 10, wherein the second light reflecting structure partially covers the substrate of a corresponding circuit board.

* * * * *